United States Patent [19]

Caputo et al.

[11] 4,433,756

[45] Feb. 28, 1984

[54] ELEVATOR SYSTEM

[75] Inventors: William R. Caputo, Wyckoff; Alan L. Husson, Hackettstown, both of N.J.

[73] Assignee: Westinghouse Electric Corp., Pittsburgh, Pa.

[21] Appl. No.: 356,685

[22] Filed: Mar. 10, 1982

[51] Int. Cl.³ .............................................. B66B 3/02
[52] U.S. Cl. ..................................... 187/29 R; 340/21
[58] Field of Search ....................... 187/29; 340/19, 21

[56] References Cited

U.S. PATENT DOCUMENTS

| Re. 27,185 | 10/1971 | Bruns et al. | 187/29 |
|---|---|---|---|
| 2,840,188 | 6/1958 | Savage | 187/29 |
| 2,938,603 | 5/1960 | Loughridge | 187/29 |
| 3,406,846 | 10/1968 | O'Connor | 187/29 X |
| 3,483,950 | 12/1969 | Simpson | 187/29 |
| 3,856,116 | 12/1974 | Savage | 187/29 X |
| 3,889,231 | 6/1975 | Tosato et al. | 187/29 X |
| 3,963,098 | 6/1976 | Lewis et al. | 187/29 |

FOREIGN PATENT DOCUMENTS 54-115852 9/1979 Japan ...................................... 340/21

*Primary Examiner*—J. V. Truhe
*Assistant Examiner*—W. E. Duncanson, Jr.
*Attorney, Agent, or Firm*—D. R. Lackey

[57] ABSTRACT

An elevator system which develops information relative to car location in the associated building from an extensible coded tape in the hoistway. The tape is tensioned and then fixed at predetermined locations such that predetermined positional relationships between the tape and the hoistway remain fixed, notwithstanding compression of the building and temperature induced dimensional changes of the tape.

25 Claims, 10 Drawing Figures

ELEVATOR SYSTEM

BACKGROUND OF THE INVENTION

1. Field of the Invention

The invention relates in general to elevator systems, and more specifically to elevator systems which determine the absolute position of the elevator car in the hoistway.

2. Description of the Prior Art

U.S. Pat. No. 3,750,850, which is assigned to the same assignee as the present application, discloses a car position arrangement which uses incremental counting to determine car position. Car movement rotates the governor sheave, or a suitable pulse wheel, and a pickup arrangement detects spaced openings disposed in the sheave or wheel. The pickup arrangement generates pulses which are counted by a reversible car position counter. By resetting the counter to zero when the elevator car is located at the lowest floor, and then counting the pulses as the car travels upwardly, each floor of the building may be identified by a predetermined count in the counter. Thus, floor position memories may be programmed accordingly, and the floor selector may relate the count in the reversible car position counter with the counts of the floor position memories. While this arrangement has operated satisfactorily, it has certain disadvantages. For example, loss of power causes loss of the information in the reversible counter. Also, electrical noise in the circuitry may be counted as incremental car movement pulses. Stretch of the cable driving the governor sheave, and wear of the governor sheave and cable, cause positional errors which require reprogramming of the floor position memories. Finally, compression or settling of the building causes the floor addresses to change, also requiring reprogramming of the floor position memories.

Certain of the disadvantages of the incremental counting arrangement for determining car position can be overcome by determining the absolute position of the elevator car in the hoistway. In determining the absolute position of the elevator car, there are at least two criteria which must be met. Firstly, resolution should be 0.125 inch, or less, if the system is to land the elevator car without a separate landing device. If a separate landing device is used, the resolution must be 1.0 inch, or less, as this is the maximum allowable mismatch when transfer is made to the landing device. Secondly, the positional information must be updated every 10 ms or less, for system stability. Absolute car position could be determined by measuring the time for some form of electromagnetic radiation to travel between the car and a fixed point in the hatch. However, even using light, which has a velocity in air of $9.8 \times 10^8$ feet per second, it would take $8.5 \times 10^{-5} \mu s$ to resolve 1.0 inch. This time differential to resolve a 1.0 inch increment far exceeds the speed capabilities of available solid state devices. Other techniques using electromagnetic radiation can be used, but they are complicated and costly.

Co-pending application Ser. No. 356,684, filed Mar. 10, 1982, entitled "Elevator System", by W. R. Caputo, which is assigned to the same assignee as the present application, discloses an absolute position elevator system which uses a coded tape. As further disclosed in this co-pending application, the absolute position of the elevator car can advantageously be used to develop a variable reference limit signal for the speed pattern clamp arrangement disclosed in U.S. Pat. No. 4,161,235, which is also assigned to the assignee of the present application. While the coded tape arrangement overcomes most of the disadvantages of the incremental counting arrangement for determining car position, it does not account for building compression, which, for example, may be as much as 12 inches for a building having a rise of 600 feet.

SUMMARY OF THE INVENTION

Briefly, the present invention is a new and improved elevator system which determines the absolute position of the elevator car via a coded tape, and which overcomes the problem of building compression. The present invention also includes a new and improved tape/tape reader arrangement which determines absolute car position at predetermined spaced increments, such as every 8 inches, for example, and which updates the car position between the spaced increments to a resolution of 0.25 inch, for example. The arrangement also determines actual car travel direction, with the positional and travel direction information being obtained from indicia disposed in only two vertical lanes on the tape, using only three tape reader pairs.

The building compression problem is overcome by constructing the tape from an extensible material, such as polyester film. The tape is pretensioned to provide a predetermined elongation or extension beyond its non-tensioned length, and the tensioned tape is fixed at predetermined spaced points in the hoistway, such as adjacent to each floor level. The predetermined elongation is selected such that the tape will not lose tension for the maximum expected building compression, and for the maximum temperature induced dimensional changes or variations in the tape. Thus, the code addresses of the fixed points remain the same, notwithstanding building compression and temperature or humidity induced dimensional changes of the tape.

The new tape/reader arrangement may be used on the extensible tape, or on any coded tape arrangement, such as the one disclosed in the hereinbefore mentioned co-pending patent application.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF PREFERRED EMBODIMENTS

Figure 1:
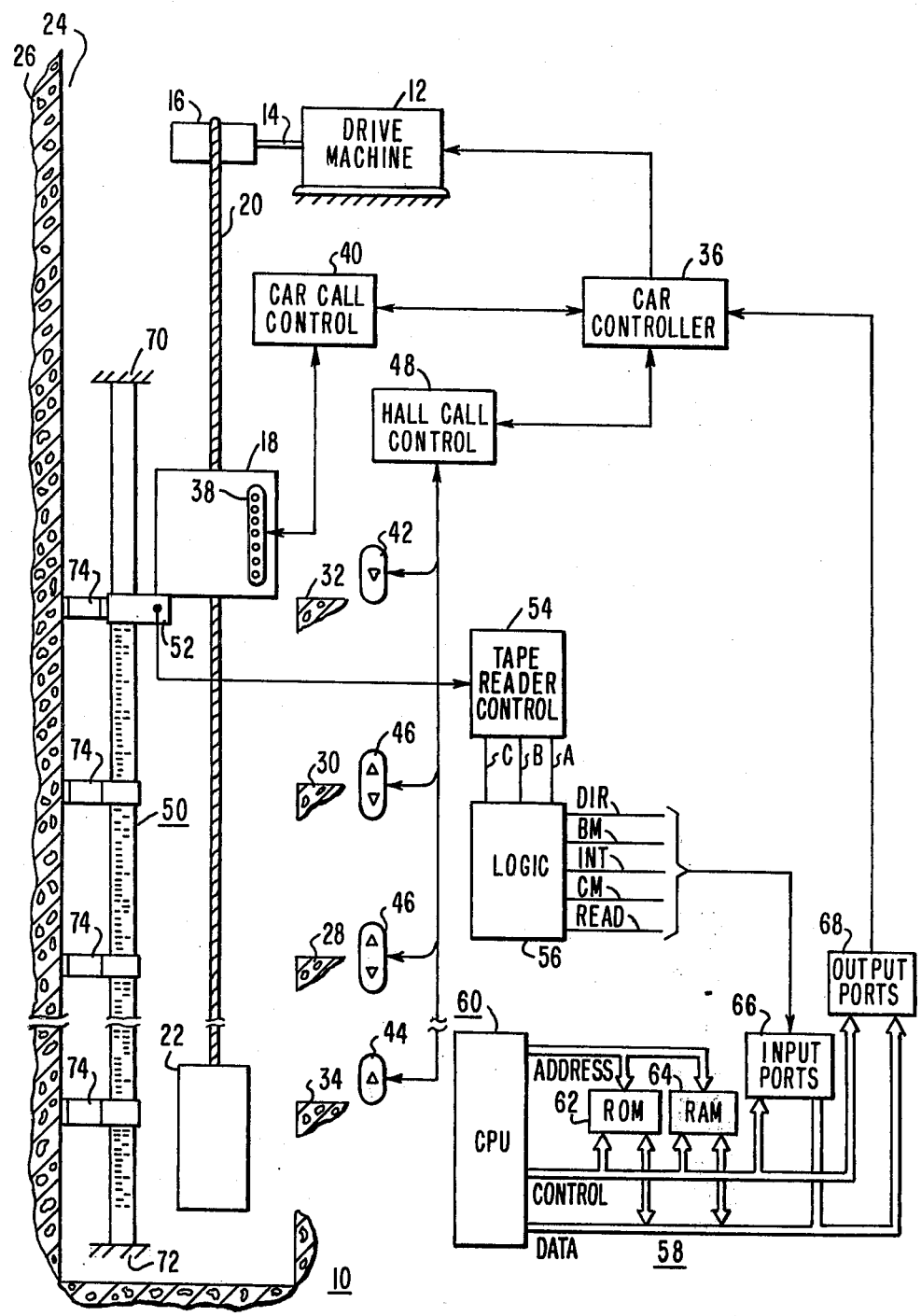
FIG. 1 is a schematic diagram of an elevator system constructed according to the teachings of the invention.

Referring now to the drawings, and to FIG. 1 in particular, there is shown a schematic diagram of an elevator system 10 constructed according to the teachings of the invention. Elevator system 10 includes a drive machine 12, which includes an AC or DC drive motor, and suitable motor control. The drive machine 12 includes a drive or output shaft 14 to which a traction sheave 16 is secured. An elevator car 18 is supported by wire ropes 20 which are reeved over the traction sheave 16, with the other ends of the ropes 20 being connected to a counterweight 22. The elevator car 18 is disposed in a hatch or hoistway 24 of a structure or building 26 having a plurality of floors or landings. For example, floors 28, 30 and 32 represent the uppermost three floors or landings, and floor 34 represents the bottom terminal floor or landing.

The movement mode of the elevator car 18 and its position in the hoistway 24 is controlled by the drive machine 12, and by a car controller 36. The car controller 36, which normally includes a floor selector and speed pattern generator, receives car call information from suitable car call pushbuttons 38 disposed in the elevator car 18, and car hall control 40. Hall call information is directed to controller 36 from suitable hall call pushbuttons, such as a down hall call pushbutton 42 located at the top floor 32, and up hall call pushbutton 44 located at the bottom floor 34, and a plurality of up and down hall call pushbuttons shown generally at 46, which are located at the intermediate floors. Hall call control 48 processes the calls received from the hall call pushbuttons. Suitable controls for providing all of these functions are well known in the art, such as disclosed in U.S. Pat. No. 3,750,850, which is assigned to the same assignee as the present application, and thus these controls need not be described in detail.

According to the teachings of the invention, the absolute position of the elevator car 18 in the hoistway 24 is determined by a coded tape 50, which extends vertically in the hoistway 24, tape reader means 52 mounted on the elevator car 18 for extracting the information from tape 50, tape reader control 54 which develops pulses or signals in response to the output of the tape reader means 52, logic means 56 for pre-processing the signals from the tape reader control 54, and control means 58 for processing the output of the logic means 56. As illustrated, the control means 58 may be digital computer, such as a microprocessor having a central processing unit (CPU) 60, a read-only memory (ROM) 62 for storing the operating program, a random-access memory (RAM) 64 for storing input data and signals developed by the operating program, input ports, shown generally at 66, and output ports, shown generally at 68.

More specifically, the vertically extending coded tape 50 is formed of an extensible or stretchable material, with the polyester film sold commercially under the trademark Mylar being excellent. The polyester film or tape is preferred because its tensile modulus and ultimate strength allow reasonable weight for pre-stretching and easily measurable elongation. The extensible tape may be easily stretched, and fixed in the hoistway while so stretched, with the dimension of elongation being selected such that the tape 50 will not come out of tension due to the maximum expected compression or settling in the building 26, and due to temperature and humidity changes. Polyester film also has other desirable characteristics, such as having a very long life, it is solvent resistant, it has low thermal and hygroscopic expansion coefficients, and it may be purchased completely opaque.

The tape 50 has a serial code formed thereon, such as a binary code, with suitable indicia for defining the code.

The extensible tape 50 is pretensioned and stretched by a predetermined dimension, and its upper and lower ends are fixed at points 70 and 72, respectively. The uppermost fixed point 70 is above the car travel path, and the lowermost fixed point 72 is below the car travel path. In addition to having its ends fixed, tape 50 is fixed at a plurality of intermediate points, with the tape 50 being in tension between each of the fixed points. The plurality of intermediate points are determined by the locations at which it is desired to provide permanent addresses, such as at each floor level. Thus, a plurality of brackets 74 are illustrated in FIG. 1 as being fixed to the tape 50, and also to the wall of the hoistway 24, with a bracket 74 being associated with each floor level. Thus, while the building may settle or compress after it is constructed, the addresses of the floors never change as the tape 50 is fixed adjacent to each floor. The floor position memories thus never need to be reprogrammed. The tension in the tape 50 may change due to temperature and humidity, but the floor addresses remain unchanged.

It is important that the initial tension in the tape 50 be selected such that the tape never comes out of tension. The procedure in selecting this tension is best illustrated by an example. Assume that the elevator rise is 600 feet, the maximum expected compression of the building is 12 inches, and the maximum expected temperature range is 25° C. A suitable polyester tape would thus have a length of about 600 feet, a width of 2 inches, a thickness of 0.010 inch, an ultimate strength of 25,000 psi, a tensile modulus of 550,000 psi, a density of 1.4 gm/cc, and a coefficient of thermal expansion of $1.7 \times 10^{-5}$ in/in°C.

The weight of the tape would only be 7.2 pounds. The change in length due to temperature variation would be 3.1 inches, which is determined by multiplying the coefficient of thermal expansion by the temperature variation and by multiplying the product by the length of the tape. The elongation is selected to be 2.5 times the maximum expected compression of the building, or 30 inches, which is easy to measure. Thus, the thermal expansion is small compared with the expected maximum compression or the pre-stretch of the tape. The stress in the tape would be 2,300 psi, which is determined by multiplying the tensile modulus by the elongation, and dividing the product by the length of the tape. This stress is only 10.9% of the ultimate tensile strength of the tape.

The weight required to hang on the tape 50 to stretch it 30 inches and develop the 2300 psi stress is 46 pounds, which is easy to handle. This weight is determined by multiplying the stress (2300 psi) times the cross-sectional area of the tape.

The tape 50 may be fastened at point 70, as shown in FIG. 1, and the weight of 46 pounds fastened to its lower end to provide the required stretch of 30 inches. If the zero reference is desired at the bottom landing or floor 34, the top of the tape 50 may now be moved and refastened such that the bottom end is precisely at the desired location. The bottom end of the tape may now be fixed and the weight removed. The tape 50 is then fastened at the desired intermediate points via the brackets 74. Each floor address is permanently fixed, and the intermediate points will also track well, although accuracy between floors is not critical.

Figure 2:
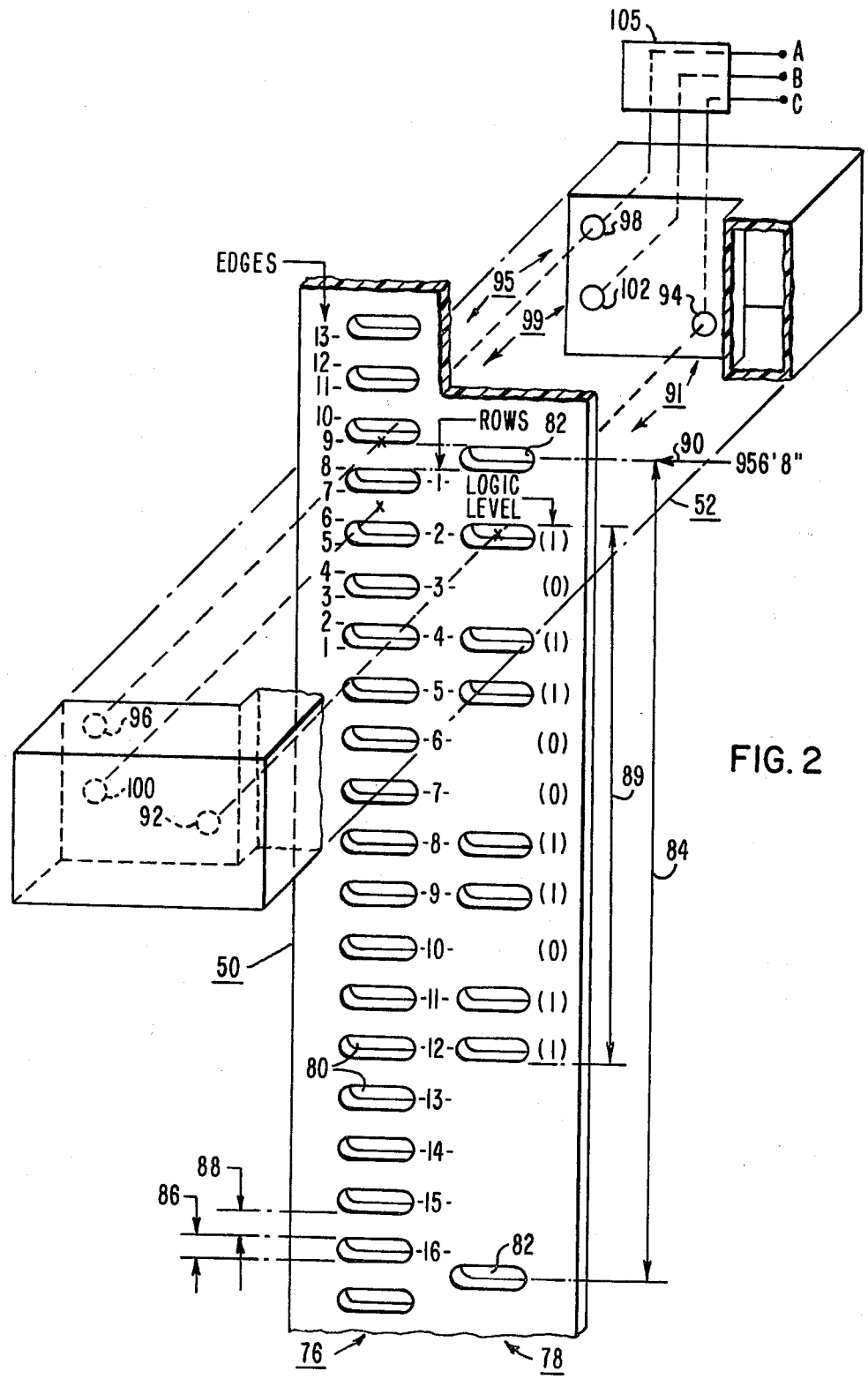
FIG. 2 is an enlarged perspective view of a coded tape and tape reader suitable for use in the elevator system shown in FIG. 1.

FIG. 2 is an enlarged perspective view of coded tape 50. While any suitable code or arrangement may be used, FIG. 2 sets forth a particularly desirable arrangement for obtaining absolute car position information, as well as car travel direction, as it only requires two vertical, serial lanes of indicia. FIG. 2 also illustrates a desirable arrangement for the tape reader means 52, as it obtains information from tape 50 with only three reader pairs.

It is desirable to determine the position of the elevator car 18 to a small increment, such as 0.5 inch, or even 0.25 inch, resolution. If absolute position is determined to this resolution at every increment, it would require a tape having 16 vertical lanes, to provide a 16 bit binary address for each small increment of travel through the building. This is not a very practical solution. Thus, the present invention determines the absolute position of the elevator car to the 0.5 inch, or 0.25 inch, resolution at predetermined larger, spaced increments of travel, such as every 8 inches of car travel. By selecting 8 inches as the travel increment, only a single vertical lane of binary code is required. Also, with 0.5 inch resolution, 16 bit capacity only requires 12 code positions on the tape, as the four least significant bits (LSB) will always be zero. With 0.25 inch resolution, only 11 code positions are required, as the 5 LSB's will be zero at each 8 inch point.

More specifically, tape 50 has first and second vertical lanes or tracks 76 and 78, respectively. One of the vertical lanes, such as the second vertical lane 78 includes the binary coded car position bits. The other lane 76 includes indicia 80 uniformly spaced along the complete length of the tape 50. The second lane, in addition to the code, includes indicia 82 uniformly spaced along the length of the tape 50, which separate the code for each of the larger increments to which the absolute car position is to be determined, which, as hereinbefore stated, is preferably 8 inches. This increment is indicated by arrow 84, which extends between two adjacent indicia 82. The binary car position code disposed between any two adjacent indicia 82 identifies the address of the uppermost indicia. As indicated in FIG. 2, the indicia in tracks 76 and 78 may be in the form of openings in the tape. With a 0.25 inch resolution, track 76 is punched with 0.25 inch wide holes or openings in the vertical direction, as indicated by reference 86, and the openings 80 are spaced 0.5 inch apart, which provides a spacing 88 between adjacent openings 80 of 0.25 inch. Thus, the edges of the openings 80 are 0.25 inch apart along the vertical track 76.

If each opening 80 is assumed to define a horizontal row across tape 50 having a vertical dimension of 0.25 inch, these rows would be vertically spaced by 0.25 inch. It is important to note that the indicia or openings 82 in tracks 78 are not horizontally aligned with openings 80, but they are disposed in the 0.25 inch spacing between the horizontal rows defined by openings 80. On the other hand, each of the coded car position information bits in track 78 is disposed in alignment with one of the openings 80 in track 76. A binary one is indicated by an opening in a code position, and a binary zero is indicated by the absence of an opening in a code position. Thus, since there are 16 horizontal rows between adjacent openings 82, with each row including an opening 80. The rows may be numbered 1 through 16 as shown in FIG. 2, with row 1 starting below the uppermost of the two vertically adjacent openings 82 under consideration. Rows 1 and 16 will not be used because an opening placed in these rows to indicate a binary one would intersect an opening 82. Also, assuming a 16 bit address to a 0.25 inch resolution, the five LSB's would be zero at each 8 inch point. Thus, only 11 of the code positions will be used, with these 11 positions being the 11 MSB's of a 16 bit binary word. These 11 code positions are selected to be in rows 2 through 12, with the MSB being in row 2. The position of the binary code is indicated by reference 89 in FIG. 2. Thus, the 16 bit address at each 8 inch point would be XXXX XXXX XXX0 0000, with the five LSB's, indicated by the zeros, not being on the tape 50. The maximum count would thus be 65,504, which, with 0.25 inch per count, represents a maximum length for the tape of 1,364.67 feet, using a 16 bit address. The address of the uppermost opening 82, indicated by arrow 90 in FIG. 2, is 1011 0011 0110 0000, which indicates a count of 45,920, or 956 feet, 8 inches, in a 0.25 inch resolution system.

The binary car position bits may be read serially with a single reader pair, and stored in a suitable register; or, they may be read simultaneously by a plurality of reader pairs at each 8 inch point. In general, the former arrangement would be preferred when the tape reader is car mounted, and the latter arrangement would be preferred when the tape reader is located in the machine room. If the tape is stationary, the tape reader would be car mounted, and if the tape is driven by car movement, the car reader would be stationary, and thus mounted in the machine room. Since in the present invention the tape 50 is stationary and the tape reader means 52 is car mounted, the binary code will be read by a single reader pair, such as an optical reader pair 91 which includes a transmitter 92, such as a light emitting diode, and a receiver 94, such as a phototransistor. In order to develop information relative to the car travel direction, and a pulse for every 0.25 inch of car travel for incrementing the car position counter between the 8 inch absolute position points, first and second additional optical reader pairs 95 and 99 are provided, with the first additional reader pair 95 including a transmitter 96 and a receiver 98, and a second additional reader pair 99 including a transmitter 100 and a receiver 102. A suitable circuit 105 develops a logic one signal when a receiver receives a signal from the associated transmitter, with the output signals responsive to reader pairs 95, 99 and 91 being referenced A, B and C, respectively.

Reader pairs 95 and 99 are aligned to read track 76 such that the waveforms generated by the two readers have a 90° phase difference, i.e., when reader pair 95 is aimed at the bottom edge of an opening, reader pair 99 is aimed at the center of the unpunched tape between two adjacent openings. Track 78 is punched with the position updating data, and it is read by reader pair 91. Depending upon their alignment with respect to track 76, the openings in track 78 may represent either the 11 most significant bits of the position update count, or a start-end marker 82. If the opening in track 78 is immediately adjacent to an opening in track 76, then it is a data bit. Openings in track 78 which lie between openings in track 76 are start-end markers. Reader pair 91 is aimed at track 78 such that when reader pair 99 is aimed at the center of the unpunched space in track 76, reader pair 91 is aimed through the center of a data position bit location.

Figure 3:
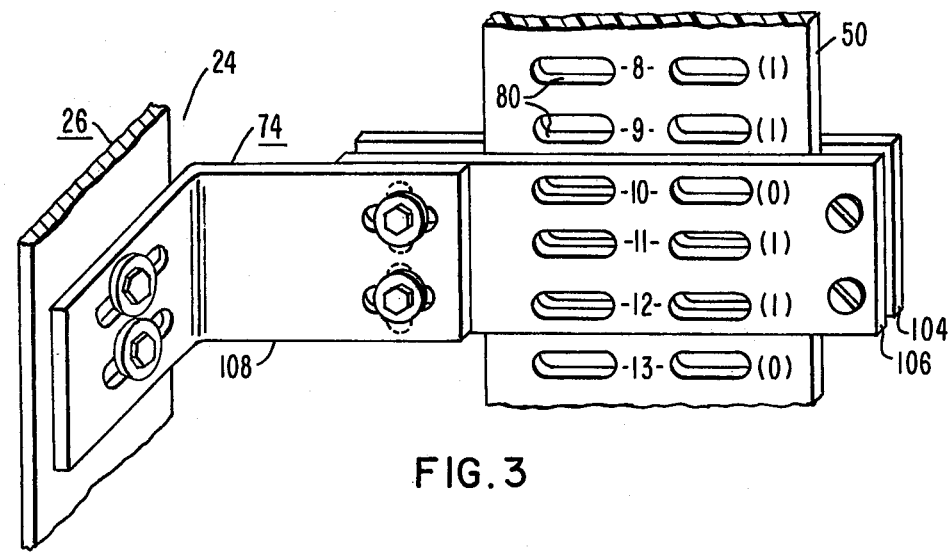
FIG. 3 is an enlarged perspective view which illustrates a suitable arrangement for fixing the coded tape shown in FIGS. 1 and 2 at spaced locations in the hatch or hoistway.

FIG. 3 is a perspective view of a bracket 74 which may be used for the brackets with the same reference numerals in FIG. 1. Bracket 74 includes first and second thin, flat plate members 104 and 106 which sandwich the tape 50 between them. Members 104 and 106 have openings therein which are aligned with the openings 80 in track 76, and the openings and code locations in track 78. A right angle member 108 interconnects the plate members 104 and 106 with a suitable fixed point in the hoistway 24. Protection for the tape 50 may be provided, if necessary, by providing one or two small diameter cables (not shown) which extend from bracket to bracket.

Figure 4:
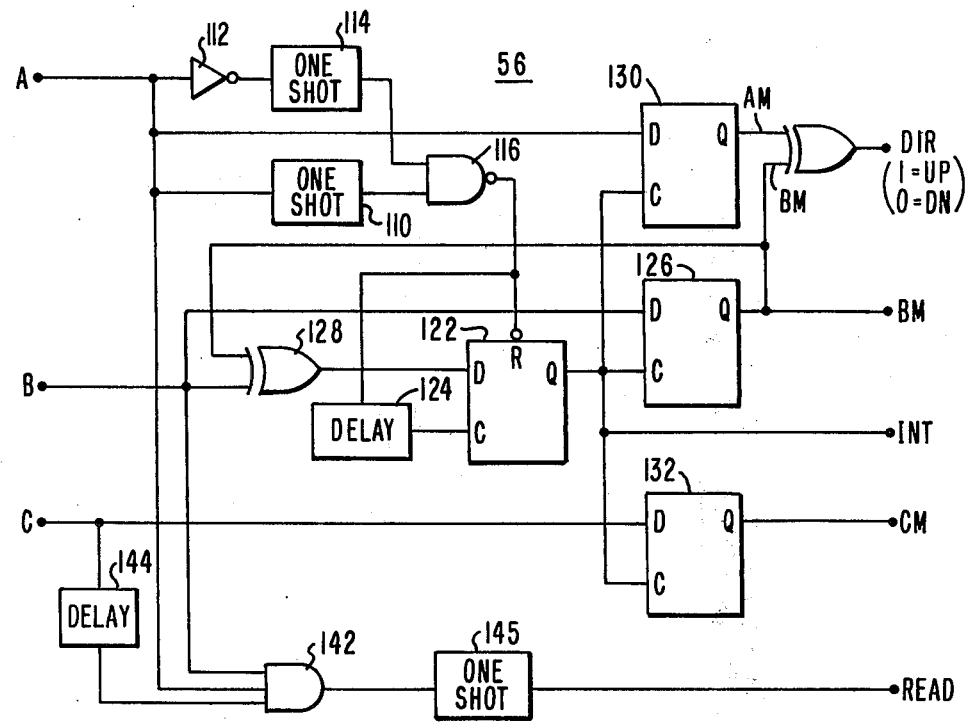
FIG. 4 is a logic diagram which illustrates logic which may be used to decode travel direction, and also provide car movement and positional code pulses from signals provided by the tape and tape reader shown in FIG. 2.
Figure 5A:
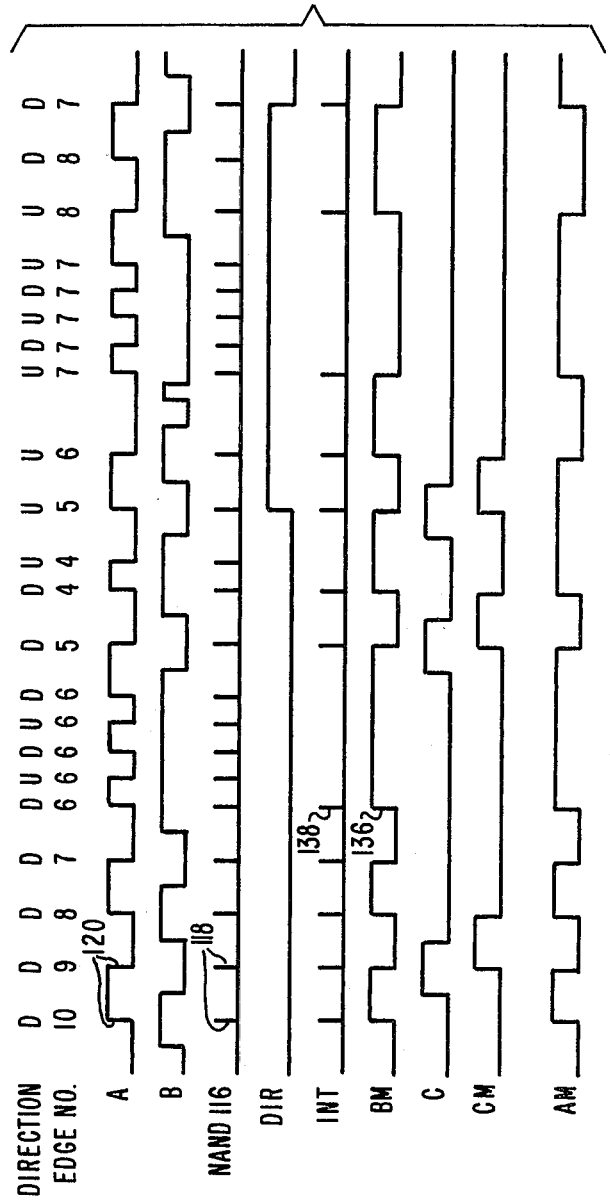
FIGS. 5A and 5B are timing diagrams which set forth the relationships between various signals developed by the tape reader shown in FIGS. 1 and 2 and by the logic diagram shown in FIG. 4.
Figure 5B:
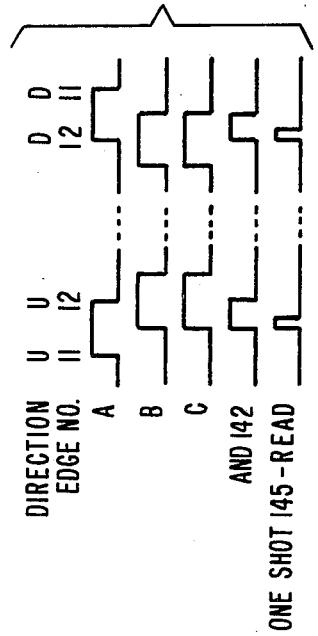

FIG. 4 is a logic diagram of logic means which may be used to provide the pre-processing logic function 56 shown in FIG. 1. FIGS. 5A and 5B are graphs of various signals and their interrelationships, which aids in understanding the logic diagram of FIG. 4. One of the benefits of the pre-processing function provided by logic means 56 is the fact that the microprocessor or computer 58 will only be interrupted after a new edge of an opening in track 76 of tape 50 has been detected by reader pair 95, thus eliminating the need for processing oscillations in car position about one edge of an opening.

Signal A from reader pair 95 is applied to a monostable multivibrator or one shot 110, and signal A is also inverted by an inverter gate 112 and applied to a one shot 114. The outputs of the one shots 110 and 114 are applied to inputs of a NAND gate 116. As shown in FIG. 5A, NAND gate 116 outputs a positive 10 μs pulse 118 on every change 120 of input signal A. The output of NAND gate 116 is applied to the reset input R of a D-type flip-flop 122, and it is also applied to the clock input C of this same flip-flop via delay means 174 which provides about a 1 μs delay. Thus, when the output of NAND gate 116 goes high, it enables flip-flop 122 for 10 μs, and after about 1 μs, it clocks flip-flop 122.

Signal B from reader pair 99 is applied to the D input of a flip-flop 126. The clock input of flip-flop 126 is connected to the Q output of flip-flop 122, and the Q output of flip-flop 126 is connected to an output terminal BM. The signal BM at this terminal represents the previous state of signal B. Signals BM and B are applied to the inputs of an exclusive OR gate 128. If the previous state of signal B, i.e., BM, and the present state of signal B, are the same, the exclusive OR gate 128 applies a logic zero to the D input of flip-flop 122. Thus, if signal A changes, but signal B has not changed since the previous change in signal A, the change in signal A has occurred at an edge which had already been recognized. The clocking of flip-flop 122 by the change in signal A thus does not change the already zero state of its Q output. It can be seen by examining FIG. 2 that in moving reader pair 95 from an edge of an opening 80 to the next edge in either direction, the signal B output of reader pair 99 much change state. Thus, if the elevator car has moved, to actually change the car position, as opposed to oscillating about a relatively fixed position, signal B will be different than the previous state of signal B (BM), and exclusive OR gate 128 will apply a logic one to the D input of flip-flop 122. When signal A changes to provide a clock pulse, the Q output of flip-flop 122 will thus be a logic one, and this logic one is used as a signal to memorize the current status of signals A, B and C via D-type flip-flops 130, 126 and 132, respectively. Flip-flops 130, 126 and 132 have the A, B and C signals applied to their D inputs, and the Q output of flip-flop 122 is applied to their clock inputs. Thus, when the car position actually changles, all three input signals are stored, and the Q output of flip-flop 122, which goes high for about 9 μs on each 0.25 inch change in car position, is connected to output terminal INT. Output terminal INT provides an interrupt signal for the microprocessor 58.

It will be noted in FIG. 5A that when signal A is first changed in response to edge number 6, signal BM changes state at 136 and interrupt signal INT is provided at 138. However, when signal A is additionally changed by edge number 6 without a corresponding change in signal B, NAND gate 116 provides a positive pulse each time, but signal BM does not change state and no interrupt signals INT are provided for interrupting the microprocessor 58. The same result may be observed in FIG. 5A when the elevator car oscillates such that edge number 7 sucessively changes the state of signal A.

The car travel direction is obtained by comparing the memorized A and B signals AM and BM, respectively, at the outputs of flip-flops 130 and 126, respectively, in an exclusive OR gate 140. It will be noted from FIG. 5A that when the elevator car is actually moving in a downward direction, signals AM and BM are the same, and that when the elevator car is actually moving in the upward direction, signals AM and BM are different. Thus, when the output signal DIR from exclusive OR gate 140 is low, it signifies the down travel direction, and when signal DIR is high, it signifies the up travel direction.

A signal READ may be developed at each 8 inch absolute position point, which signal may be used to transfer the car position word from a temporary location in microprocessor 58 to a car position counter 210, which may be located in the car controller 36. Signals A, B and C are applied to the inputs of a 3-input AND gate 142, with a signal C being delayed by about 1 μs by delay means 144. When signals A, B and C are high simultaneously, it indicates that signal C is high due to the detection of one of the 8 inch openings 82, and not due to a code opening. The delay means 144 prevents confusion with a code opening. Thus, a true or high signal READ means the car position counter should be loaded with the value of the temporary car position word, as will be hereinafter described. FIG. 5B illustrates the waveforms which generate the signal READ.

Figure 6A:
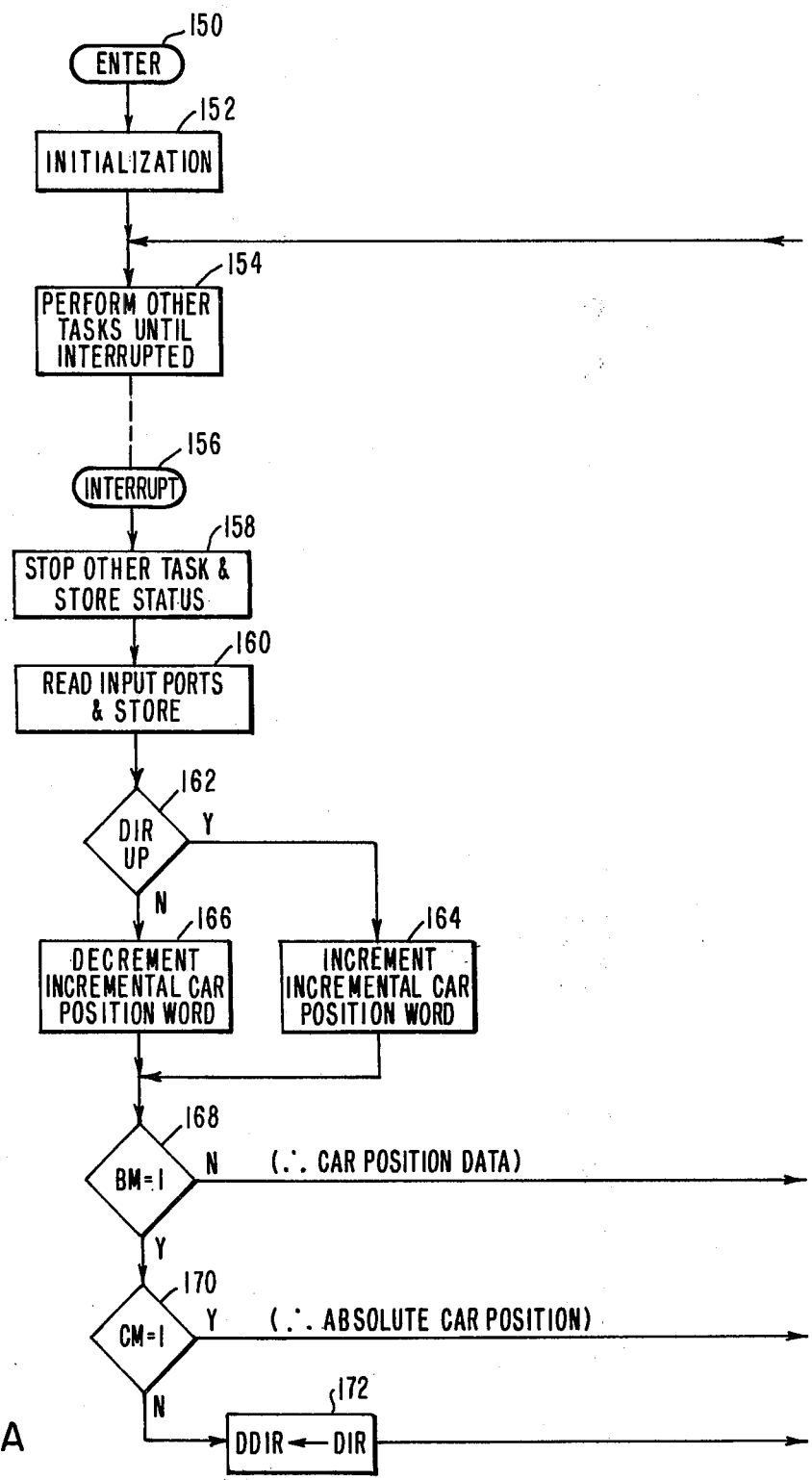
FIGS. 6A and 6B may be combined to set forth a detailed flow chart which may be used to develop a suitable program for the computer shown in FIG. 1.
Figure 6B:
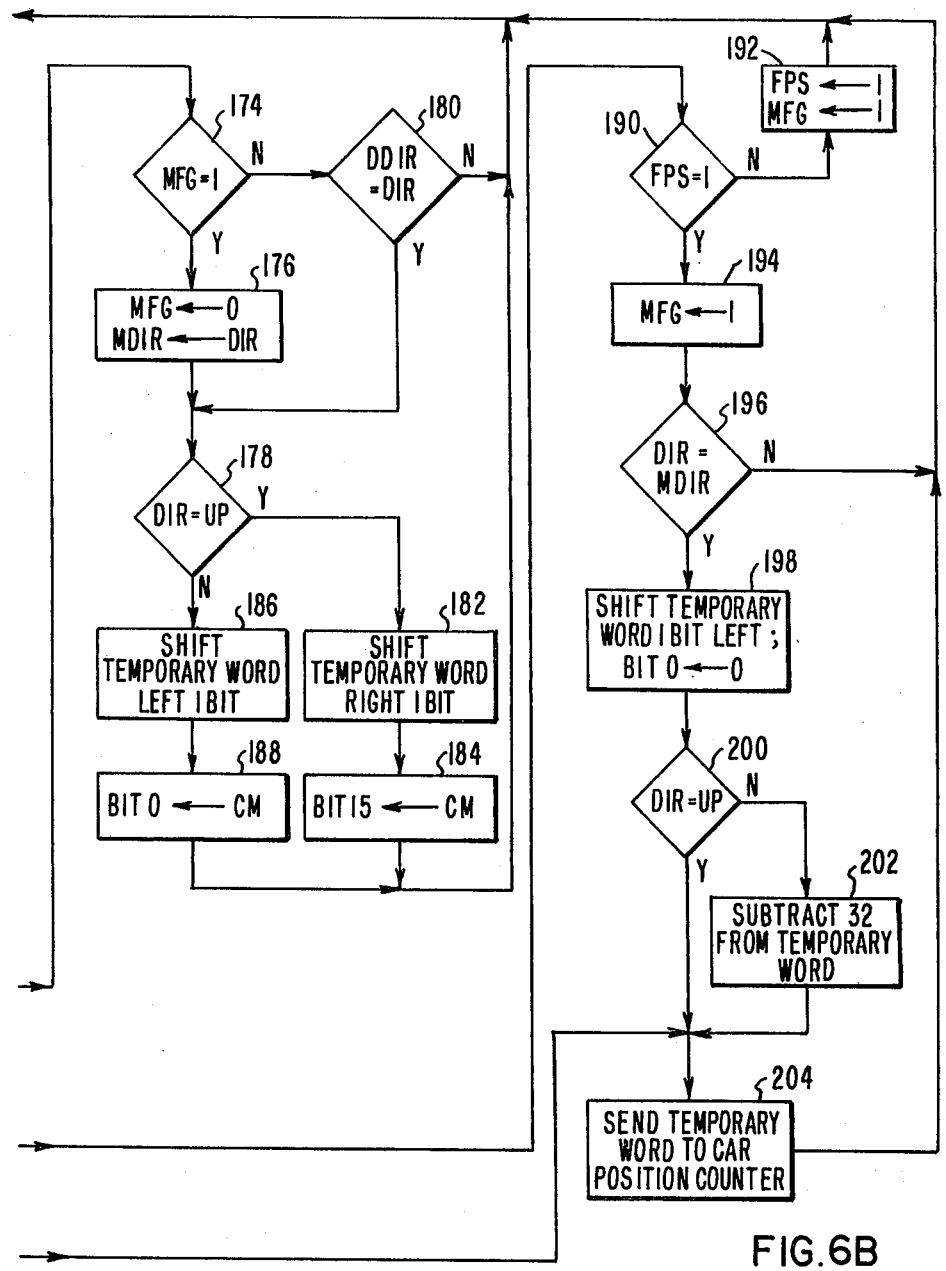

FIGS. 6A and 6B may be assembled to provide a detailed flowchart of a program which may be used by the microprocessor 58 shown in FIG. 1 for developing the car position from the pre-processed signals provided by the logic function 56 shown in FIG. 4. When logic function 56 detects a meaningful change in car position, i.e., an actual change as opposed to a slight oscillation of the elevator car, the signal INT goes true, which functions as the interrupt signal for the microprocessor 58, signifying that new car position information is ready for processing.

More specifically, the program is entered at 150 and the program is initialized at step 152, such as by clearing the program flags, temporary words, and the like. The microprocessor 58 can then perform other tasks, as indicated by step 154. When the car position has changed and logic function 56 provides a true interrupt signal INT, microprocessor 58 recognizes the interrupt 156, and it goes into an interrupt service program at step 158. This program stops the other task and stores its status, in order to enable an orderly return thereto. Step 160 then reads the input ports 66 and stores the signals provided to it by a logic function 56 in RAM 64.

Figure 7:
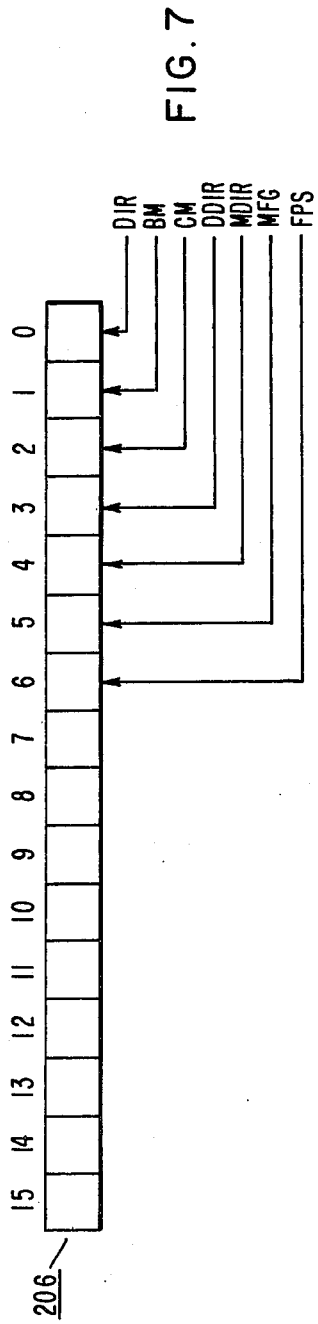
FIG. 7 is a diagram which illustrates a status word maintained by the computer shown in FIG. 1 during the running of the program developed from the flow chart shown in FIGS. 6A and 6B.

FIG. 7 indicates a memory word 206 in RAM 64 for storing signals DIR, BM and CM.

Figure 8:
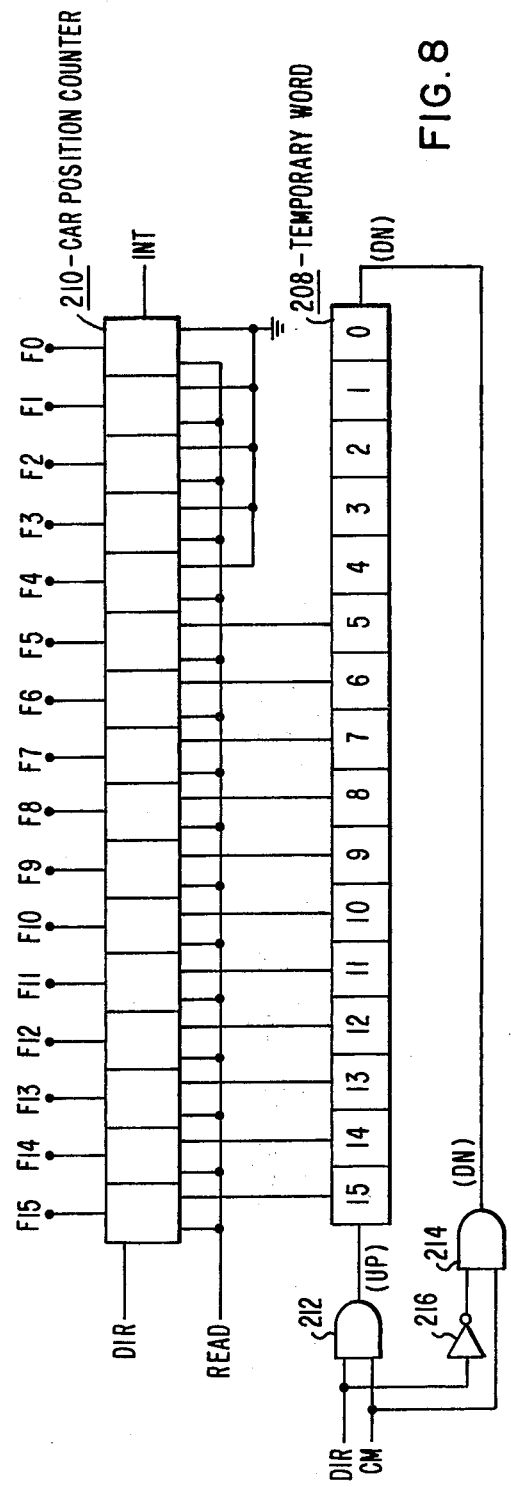
FIG. 8 is a diagram which illustrates the functional relationships between a temporary car position word, which may be maintained by the computer shown in FIG. 1, and a car position counter, which may be maintained outside of the computer in the car controller.

Each time an interrupt is provided, it indicates the elevator car has moved by at least the incremental distance, i.e., 0.25 inch in the present example, and the car position counter 210 should be incremented when the travel direction of the elevator car is upwardly, and decremented when it is downwardly. This updating of car position between the absolute car position points may be performed in software, or hardware, or both. FIG. 8 is a schematic diagram which illustrates a hybrid arrangement wherein the absolute car position word is formed in RAM 64 in a temporary word location 208 and transferred to the car position counter 210, which may be in the car controller 36. The signals DIR and INT, in addition to being sent to the computer 58, may also be used to increment or decrement counter 210. Signal DIR selects the counting direction of counter 210, and signal INT increments or decrements the car position count according to the counting direction selected by signal DIR. The incremental counting may also be maintained in RAM 64, or it may be performed solely in RAM 64, with the updated count being sent to the car controller 36 upon each interrupt. When performed in software, step 162 checks the car travel direction, and if it is up (DIR=1), step 164 increments the incremental car position word stored in in RAM 64, and if it is down (DIR=0) step 166 decrements the incremental car position word.

Step 168 checks the logic level of signal BM (bit position 1 of word 206 in FIG. 7). If signal BM is a logic 1, the orientation of the reader pairs is such that reader pair 91 cannot be reading a car position data bit, and the program goes to step 170. Step 170 checks the logic level of signal CM (bit position 2 of word 206 in FIG. 7). If it is not a logic one, it indicates that the elevator car is not located at an absolute position point, i.e., reader pair 91 is not oriented with an opening 82. Thus, with signal BM high and signal CM low, it indicates the reader pair 91 has just moved away from a car position bit, and step 172 stores the car travel direction DIR in bit position 3 of word 206 in FIG. 7, with this memorized direction being referred as bit DDIR.

If the program directly updates counter 210 every 0.25 inch of car travel, step 172 advances to step 204 which sends the temporary word 208, along with the incremental car position between the 8 inch points, to the car position counter 210. If the incremental counting between openings 82 is performed directly on the car position counter 210, as shown in FIG. 8, step 172 may return to step 154. Step 204 also returns to step 154.

When step 168 finds that signal BM is a logic zero, reader pair 91 is oriented with, or directed towards, a position which may contain car position information, and the program advances to step 174. Step 174 checks a flag MFG located at bit position 5 of word 206 in RAM 64, to see if this is the first data position encountered since the last start/end marker (opening 82) was detected. If it is, flag MFG will be a "1" and step 176 resets flag MFG. Step 176 also stores the car travel direction DIR at bit position 4 of word 206 in FIG. 7, which memorized car direction bit is referenced MDIR. Step 176 then advances to step 178.

If step 174 found flag MFG a zero, this is not the first data position encountered since a start/end opening 82 was detected and step 180 checks to see if this data position was arrived at by traveling in the same direction (DIR) as the car was traveling when it moved off of the last data position (DDIR). If not, then this is the same data position interpreted previously and the program returns to step 154. If the directions DIR and DDIR are the same, then this is a new data bit, and step 180 proceeds to step 178.

Step 178 checks the car direction signal DIR. If the car travel direction is up (DIR=1), step 182 shifts the temporary word 208 in RAM 64 (shown in FIG. 8) one bit to the right, and the logic level of signal CM is stored in bit position 15. When the car is traveling in the up direction, each new car position bit received is a higher significant bit than the last, and thus it is entered at bit position 15. This function is illustrated in hardware form in FIG. 8, assuming the temporary word 208 to be developed in a register. AND gates 212 and 214, and an inverter gate 216 direct the CM signal to the proper end of the register according to the logic level of signal DIR.

If step 178 finds the car travel direction is down (DIR=0), step 186 shifts word 208 one bit position to the left, and step 188 stores the logic level of signal CM at bit position zero of word 208. When the car is traveling in the down direction, each new car position bit received is a lower significant bit than the last, and thus it is entered at bit position zero. Steps 184 and 188 both return to step 154.

When step 170 finds signal CM a logic one, and since step 168 already found signal BM a logic zero, it indicates reader pair 91 is oriented with an opening 82. Thus, the elevator car 18 is positioned at one of the 8 inch points (in this example) at which the absolute position of car 18 in the hoistway 24 is known. Step 170 advances to step 190 to process the temporary word 208 into condition for transfer to the car position counter.

More specifically, step 190 checks flag FPS located at bit position 6 on word 206 in FIG. 7. If flag FPS is a zero, it indicates that this is the first running of the program since power was turned on and the program initialized, and it is not desired to utilize the car position data stored in the temporary word 208 at this point in time. Thus, step 192 sets flag FPS to a one, and it sets flag MFG to a one, so that step 174 will recognize the next data bit as being the first since an opening 82 was detected. The program then returns to step 154.

If step 190 finds flag FPS a logic one, step 194 sets flag MFG to a one, for use by step 174. Step 196 checks to see if the detected opening 82 was approached by traveling in the same direction (DIR) as the travel direction (MDIR) when the last data position was read. If not, this is not a "new" opening 82, and the program returns to step 154. If the directions are the same, the temporary car position word 208 shown in FIG. 8 is shifted left one bit position in step 198. This step accounts for the fact that the position immediately adjacent to an opening 82 does not contain car position information. Shifting word 208 one position left will place the MSB of the absolute car position in bit position 15, regardless of car travel direction.

It has been established by design that the car position data between any two adjacent openings 82 gives the position of the upper opening. Thus, if the detected opening is encountered during downward travel of the elevator car, the data in the temporary word 208 describes the location of the next higher opening. Thus, the temporary word must be decremented by 32 counts (for 0.25 inch resolution with 8 inch spacing of openings 82). This function is accomplished by steps 200 and 202, with step 200 checking car direction. If this check finds that the car is traveling in the downward direction, step 202 subtracts 10 0000 (32) from the temporary word 208. If step 200 finds the travel direction to be up, the information in word 208 correctly describes the location of the detected opening 82. Steps 200 and 202 both advance to step 204, which sends the temporary word 208 to the output ports 68, and then to the car controller 36.

In summary, there has been disclosed a new and improved elevator system in which the absolute position of the elevator car is determined, and the addresses of the floors remain constant notwithstanding compression of the associated building. Thus, the initial floor addresses used by the car controller 36 and associated floor address memories in making deceleration decision never need reprogramming. Also disclosed is a new and improved arrangement which uses only two vertical tracks of indicia or information on a tape, and only three reader pairs are required to obtain car position and travel direction information therefrom. A new and improved pre-processing function of the tape data discriminates between car oscillation and actual movement of the elevator car in a predetermined direction, signifying that new position and travel direction data are ready for processing only when the car position has changed in a meaningful way.

We claim as our invention:

1. An elevator system, comprising:
    a building having a hoistway and a plurality of floors,
    an elevator car mounted for vertical movement in the hoistway of said building to serve the floors therein,
    elevator control means for controlling the movement of said elevator car,
    and a vertically extending, extensible coded tape in said hoistway, which, in cooperation with said elevator control means, identifies the absolute position of said elevator in said hoistway,
    said tape being tensioned and stretched a predetermined dimension beyond its untensioned length, and fixed at predetermined locations such that the positional relationship between at least certain of the floors and the tape remains unchanged, notwithstanding compression of said building.

2. The elevator system of claim 1 wherein the predetermined locations at which the tape is fixed includes a location adjacent to each floor whose positional relationship relative to the tape is to be maintained.

3. The elevator system of claim 1 wherein the predetermined stretched dimension of the tape is selected such that the tape will remain in tension for the maximum compression of the building, and during temperature induced dimensional changes of the tape.

4. The elevator system of claim 1 wherein the tape is formed of a polyester film.

5. The elevator system of claim 1 wherein the tape has first and second vertical lanes of indicia, with the indicia of the first lane being uniformly spaced along the length of the tape, and with the indicia of the second lane including a serial code.

6. The elevator system of claim 5 wherein the indicia of the second lane also includes uniformly spaced absolute position indicia, each of which separates the serial code such that the code between any two adjacent absolute position indicia defines the position address of a selected one of said two adjacent absolute position indicia.

7. The elevator system of claim 6 wherein the absolute position indicia have a predetermined positional relationship with the indicia of the first lane, which relationship is different than the positional relationship of the serial code to the indicia of the first lane.

8. The elevator system of claim 6 wherein the indicia of the serial code are each disposed adjacent to and in horizontal alignment with one of the indicia of the first lane, while the absolute position indicia are vertically offset from such horizontal alignment.

9. The elevator system of claim 5 wherein the elevator control means includes first, second and third indicium reader pairs, with the first and second reader pairs being vertically spaced relative to one another and oriented to detect indicia in the first lane, and with the third reader pair being oriented to detect indicia in the second lane.

10. The elevator system of claim 9 wherein the indicia of the first lane include uniformly spaced openings defined by edges spaced a predetermined dimension in the vertical direction, with the uniform spacing and said predetermined dimension being selected such that the edges of the adjacent openings are uniformly spaced along the tape.

11. The elevator system of claim 10 wherein the first, second and third reader pairs are arranged such that when the first reader pair is aligned with a predetermined edge of an opening, the second reader pair is aligned with the midpoint between two vertically adjacent openings, and the third reader pair is aligned to detect a code indicium.

12. The elevator system of claim 9 including logic means responsive to the first, second and third reader pairs, with said logic means including means for discriminating between signals provided by the reader pairs which are responsive to a meaningful change in car position and signals provided by the reader pairs which are responsive to meaningless changes such as oscillation of the elevator car.

13. The elevator system of claim 9 including logic means responsive to the first, second and third reader pairs, with said logic means including means for determining the actual travel direction of the elevator car.

14. The elevator system of claim 9 wherein the serial code identifies the absolute position of the elevator car at predetermined spaced increments, and the logic means includes means for providing incremental distance pulses for updating the car position between the predetermined spaced increments.

15. The elevator system of claim 9 wherein the serial code identifies the absolute position of the elevator car at predetermined spaced increments, and including logic means responsive to the first, second and third reader pairs, with said logic means including means for discriminating between signals provided by the reader pairs which are responsive to a meaningful change in car position and signals provided by the reader pairs which are responsive to meaningless changes, such as oscillation of the elevator car, means for determining the actual travel direction of the elevator car, and means for providing incremental distance pulses for updating the car position between the predetermined spaced increments.

16. An elevator system, comprising:
   a building having a hoistway and a plurality of floors,
   an elevator car mounted for vertical movement in the hoistway of said building to serve the floors therein,
   elevator control means for controlling the movement of said elevator car,
   and car position means, including a coded tape and tape reader means arranged for relative motion in response to the movement of the elevator car,
   said tape having first and second vertical lanes of indicia, with the indicia of the first lane being uniformly spaced along the length of the tape, and with the indicia of the second lane including a serial code,
   said tape reader means including first, second and third indicium reader pairs, with the first and second reader pairs being vertically spaced relative to one another and oriented to detect indicia in the first lane, and with the third reader pair being oriented to detect indicia in the second lane.

17. The elevator system of claim 16 wherein the indicia of the second lane additionally include uniformly spaced absolute position indicia, each of which separates the serial code such that the code between any two adjacent absolute position indicia defines the position address of a selected one of said two adjacent absolute position indicia.

18. The elevator system of claim 17 wherein the absolute position indicia have a predetermined positional relationship with the indicia of the first lane, which relationship is different that the positional relationship of the serial code to the indicia of the first lane.

19. The elevator system of claim 17 wherein the indicia of the serial code are each disposed adjacent to and in horizontal alignment with one of the indicia of the first lane, while the absolute position indicia are vertically offset from such horizontal alignment.

20. The elevator system of claim 16 wherein the indicia of the first lane includes uniformly spaced openings defined by edges spaced by a predetermined dimension in the vertical direction, with the uniform spacing and said predetermined dimension being selected such that the edges of adjacent openings are uniformly spaced along the tape.

21. The elevator system of claim 20 wherein the first, second and third reader pairs are arranged such that when the first reader pair is aligned with a predetermined edge of an opening, the second reader pair is aligned with the midpoint between two vertically adjacent openings, and the third pair is aligned to detect a code indicium.

22. The elevator system of claim 16 including logic means responsive to the first, second and third reader pairs, with said logic means including means for discriminating between signals provided by the reader pairs which are responsive to a meaningful change in car position and signals provided by the reader pairs which are responsive to meaningless changes such as oscillation of the elevator car.

23. The elevator system of claim 16 including logic means responsive to the first, second and third reader pairs, with said logic means including means for determining the actual travel direction of the elevator car.

24. The elevator system of claim 6 wherein the serial code identifies the absolute position of the elevator car at predetermined spaced increments, and including logic means responsive to the first, second and third reader pairs, said logic means including means for providing incremental distance pulses for updating car position between the predetermined spaced increments.

25. The elevator system of claim 16 wherein the serial code identifies the absolute position of the elevator car at predetermined spaced increments, and including logic means responsive to the first, second and third reader pairs, with said logic means including means for discriminating between signals provided by the reader pairs which are responsive to a meaningful change in car position, and signals provided by the reader pairs which are responsive to meaningless changes, such as oscillation of the elevator car, means for determining the actual travel direction of the elevator car, and means for providing incremental distance pulses for updating car position between the predetermined spaced increments.

* * * * *